US012635418B2

(12) United States Patent
Huang et al.

(10) Patent No.: US 12,635,418 B2
(45) Date of Patent: May 19, 2026

(54) CERAMIC CUTTER MATERIAL WITH A PIEZOELECTRIC EFFECT AND PREPARATION METHOD THEREOF, AND CUTTING TOOL

(71) Applicants: YANSHAN UNIVERSITY, Qinhuangdao (CN); SHANDONG UNIVERSITY, Jinan (CN)

(72) Inventors: Chuanzhen Huang, Qinhuangdao (CN); Kai Meng, Qinhuangdao (CN); Zhenyu Shi, Jinan (CN); Zhen Wang, Qinhuangdao (CN); Longhua Xu, Qinhuangdao (CN); Dun Liu, Jinan (CN); Shuiquan Huang, Qinhuangdao (CN); Xiaolan Bai, Jinan (CN)

(73) Assignees: YANSHAN UNIVERSITY, Qinhuangdao (CN); SHANDONG UNIVERSITY, Jinan (CN)

( * ) Notice: Subject to any disclaimer, the term of this patent is extended or adjusted under 35 U.S.C. 154(b) by 929 days.

(21) Appl. No.: 17/893,563

(22) Filed: Aug. 23, 2022

(65) Prior Publication Data

US 2023/0232721 A1     Jul. 20, 2023

(30) Foreign Application Priority Data

Jan. 18, 2022   (CN) .......................... 202210055393.0
Mar. 16, 2022   (CN) .......................... 202210258809.9

(51) Int. Cl.
*H10N 30/85*        (2023.01)
*B23B 27/14*        (2006.01)
             (Continued)

(52) U.S. Cl.
CPC ......... *H10N 30/852* (2023.02); *B23B 27/148* (2013.01); *C04B 35/10* (2013.01);
             (Continued)

(58) Field of Classification Search
CPC .. H10N 30/852; H10N 30/053; H10N 30/092; H10N 30/50; H10N 30/05;
             (Continued)

(56) References Cited

U.S. PATENT DOCUMENTS

2002/0127384 A1*  9/2002  Mulligan ............. H10N 30/702
                                                    428/292.1

FOREIGN PATENT DOCUMENTS

CN        106736857 A  *  5/2017  ......... B23Q 17/0952
CN        110465669 A  * 11/2019  ................ B22F 7/02
JP          2644876 B2 *  8/1997  ............. C04B 35/80

OTHER PUBLICATIONS ip.com translation of CN-106736857-A (Year: 2025).*
ip.com translation of JP-2644876-B2 (Year: 2025).*
ip.com translation of CN-110465669-A (Year: 2025).*

* cited by examiner

*Primary Examiner* — Michael Zhang
(74) *Attorney, Agent, or Firm* — Oliff PLC

(57)                ABSTRACT

A ceramic tool material, in particular with piezoelectric effect and a preparation method thereof, and a cutting tool. The ceramic tool material includes the following raw materials by weight: 30-70 parts of matrix material, 30-70 parts of piezoelectric material, 5-10 parts of binder, and 10-20 parts of reinforcing phase and can be made into cutting tools. The cutting tool has a piezoelectric effect and excellent mechanical properties and can convert the cutting force signal into the charge signal during machining. By collecting charge signals, a cutting force can be measured and ceramic cutting tool condition can be monitored. Cutting force measurement function and high mechanical properties are integrated. A ceramic tool material with piezoelectric effect can measure the cutting force on the premise by meeting the cutting performance requirements.

12 Claims, 1 Drawing Sheet

(51) Int. Cl.

| | |
|---|---|
| *C04B 35/10* | (2006.01) |
| *C04B 35/468* | (2006.01) |
| *C04B 35/491* | (2006.01) |
| *C04B 35/626* | (2006.01) |
| *C04B 35/645* | (2006.01) |
| *C22C 29/12* | (2006.01) |
| *C22C 30/00* | (2006.01) |
| *C22C 32/00* | (2006.01) |
| *H10N 30/053* | (2023.01) |
| *H10N 30/092* | (2023.01) |
| *H10N 30/50* | (2023.01) |

(52) U.S. Cl.

CPC ........ *C04B 35/4684* (2013.01); *C04B 35/491* (2013.01); *C04B 35/6261* (2013.01); *C04B 35/645* (2013.01); *C22C 29/12* (2013.01); *C22C 30/00* (2013.01); *C22C 32/0005* (2013.01); *H10N 30/053* (2023.02); *H10N 30/092* (2023.02); *H10N 30/50* (2023.02); *C04B 2235/3206* (2013.01); *C04B 2235/3217* (2013.01); *C04B 2235/3236* (2013.01); *C04B 2235/3249* (2013.01); *C04B 2235/3826* (2013.01); *C04B 2235/3843* (2013.01); *C04B 2235/405* (2013.01); *C04B 2235/6581* (2013.01)

(58) Field of Classification Search

CPC ... B23B 27/148; C04B 35/10; C04B 35/4684; C04B 35/491; C04B 35/6261; C04B 35/645; C04B 2235/3206; C04B 2235/3217; C04B 2235/3236; C04B 2235/3249; C04B 2235/3826; C04B 2235/3843; C04B 2235/405; C04B 2235/6581; C04B 35/49; C04B 2235/3248; C04B 2235/3296; C04B 2235/77; C04B 2237/343; C04B 2237/346; C04B 35/119; C04B 35/4682; C04B 35/468; C04B 35/48; C04B 35/622; C04B 2235/3244; C04B 2235/404; C04B 2235/602; C04B 2235/656; C04B 2235/6567; C04B 2235/775; C04B 2235/96; C22C 29/12; C22C 30/00; C22C 32/0005; C22C 29/00; B23Q 17/0966; B22F 7/06; B22F 2005/001; B32B 18/00

See application file for complete search history.

CERAMIC CUTTER MATERIAL WITH A PIEZOELECTRIC EFFECT AND PREPARATION METHOD THEREOF, AND CUTTING TOOL

CROSS-REFERENCES TO RELATED APPLICATIONS

This application claims priority benefits to Chinese Patent Application No. 2022100553930, filed 18 Jan. 2022, and Chinese Patent Application No. 202210258809.9, filed 16 Mar. 2022, the contents of which are incorporated herein by reference.

TECHNICAL FIELD

The present invention belongs to the field of machining and relates to a ceramic tool material, in particular to a ceramic tool material a piezoelectric effect and a fabrication method thereof, and a cutting tool.

BACKGROUND

Disclosing the information in this background technical part is only for enhancement of understanding of the general background of the invention and should not necessarily be taken as an acknowledgment or any form of suggestion that this information forms the prior art already known to a person skilled in the art.

By monitoring the cutting force, the tool wear condition, tool life, and workpiece surface quality can be predicted, to optimize the processing parameters and improve the machining quality and efficiency. According to the inventor's research, at present, the cutting force is generally measured by a professional force sensor clamped to the workbench. However, the force sensor has the problems of large volume, complex structure, and high cost.

SUMMARY

To overcome the defects of the prior art, the present invention aims to provide a ceramic tool material with a piezoelectric effect and a fabrication method thereof, and a cutting tool, wherein the ceramic tool material integrates a cutting force measuring function and high mechanical properties can be measured the cutting force on the premise of meeting the cutting performance requirement, that is, the cutting force can be measured without a professional dynamometer during the cutting, and has the advantages of simple structure, small volume, high hardness, high bending strength, and fracture toughness, convenient installation and so on.

For achieving the above purpose, the technical solution of the present invention is as follows: A first aspect provides a ceramic tool material with piezoelectric effect, in parts by weight, comprising the following raw materials: 30-70 parts of matrix material, 30-70 parts of piezoelectric material, 5-10 parts of binder, and 10-20 parts of reinforcing phase. The present invention combines the matrix material with the piezoelectric material to enable the ceramic tool material to have the piezoelectric effect so that the cutting force can be measured; through the addition of the binder and the reinforcing phase, the mechanical properties of the ceramic tool material can be guaranteed, so that the cutting force can be measured on the premise of meeting the cutting performance requirements.

Further, the matrix material comprises one or more of $Al_2O_3$, $Si_3N_4$, and CBN.

Further, the piezoelectric material comprises one or more of PZT, $BaTiO_3$, $PbTiO_3$, $(Bi_{1/2}Na_{1/2}) TiO_3$, and $(Bi_{1/2}K_{1/2}) TiO_3$.

Further, the binder comprises one or more of Ni, Co, and Cr, and the reinforcing phase comprises one or more of TiC, WC, SiC, MgO, $TiO_2$, and $ZrO_2$.

The verification shows that the selection of the above materials can make the ceramic cutter materials have higher mechanical properties, to avoid the problem that the mechanical properties decline due to the addition of piezoelectric materials and cannot meet the cutting performance.

A second aspect provides a fabrication method of a ceramic tool material with the piezoelectric effect mentioned above, comprising: mixing raw materials, obtaining powder after performing a ball milling and sieving, paving and compacting the powder, and performing a vacuum hot-pressing sintering.

A third aspect provides an application of a ceramic tool material with the piezoelectric effect mentioned above in cutting tools.

A fourth aspect provides a cutting tool, being fabricated from a ceramic tool material with the piezoelectric effect mentioned above.

A fifth aspect provides a multi-layer cutting tool, being fabricated from a ceramic tool material with the piezoelectric effect mentioned above, and comprising at least one matrix layer and at least one piezoelectric layer, wherein the matrix layer is made of part of the raw material of the ceramic tool material with piezoelectric effect, and the piezoelectric layer is made of part of the raw material of the ceramic tool material with piezoelectric effect.

The cutting tool and the multi-layer cutting tool provided by the present invention have the piezoelectric effect and can convert the cutting force into a charge signal. By collecting the charge signal, the cutting force can be measured and the condition of the cutting tool can be monitored.

Compared with the prior art, the present invention has the following advantages: The existing cutting force sensor mainly comprises a tool holder type and a clamp type, an internal structure of the sensor is complex and the volume of the sensor is large; and an original tool holder needs to be removed, a clamp is additionally mounted, in use, which will affect the performance of a machine tool itself, including the precision of the machine tool, the integral rigidity of the machine tool, etc. According to the present invention, a cutting function and a sensing function of the cutter are integrated, the ceramic tool is not only the cutting tool but also the sensor, has no impact on the machine tool system, has good compatibility and interchangeability, and is simple to assemble, safe and reliable, and can be used without changing the structure and system of the existing machine tool.

BRIEF DESCRIPTION OF THE DRAWINGS

The accompanying drawings constituting a part of the present invention are used to provide a further understanding of the present invention. The exemplary examples of the present invention and descriptions thereof are used to explain the present invention and do not constitute an improper limitation of the present invention.

DETAILED DESCRIPTION

Figure 1:
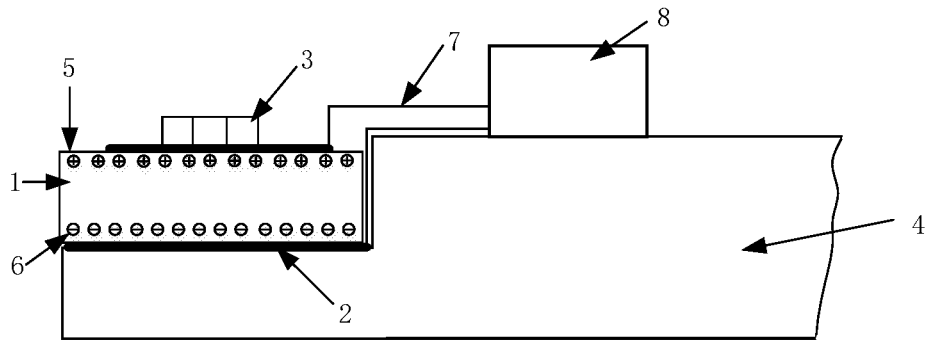
FIG. 1 shows a schematic diagram of cutting force measurement and cutting tool condition monitoring of examples of the present invention.

It should be pointed out that the following detailed descriptions are all illustrative and are intended to provide further descriptions of the present invention. Unless otherwise specified, all technical and scientific terms used in the present invention have the same meanings as those usually understood by a person of ordinary skill in the art to which the present invention belongs.

It should be noted that the terms used herein are merely used for describing specific embodiments, and are not intended to limit exemplary embodiments of the present disclosure. As used herein, the singular form is also intended to include the plural form unless the context dictates otherwise. In addition, it should further be understood that the terms "comprise" and/or "comprising" used in this specification indicate that there are features, steps, operations, devices, components, and/or combinations thereof.

In view of the problems of large volume, complex structure, and high cost of the existing detection instrument of cutting force in machining, the present invention provides a ceramic tool material with piezoelectric effect and a fabrication method thereof, and a cutting tool.

According to a typical embodiment of the present invention, there provides a ceramic tool material with a piezoelectric effect, which comprises the following raw materials in parts by weight: 30-70 parts of matrix material, 30-70 parts of piezoelectric material, 5-10 parts of binder and 10-20 parts of reinforcing phase.

According to the invention, the piezoelectric material, the binder, and the reinforcing phase are added into the matrix material, which not only makes the cutter material have the piezoelectric effect but also ensures the mechanical property of the ceramic tool material so that the cutting force can be measured on the premise that the ceramic tool material meets the cutting performance requirement.

In some examples, the matrix material comprises one or more of $Al_2O_3$, $Si_3N_4$, and CBN.

In some examples, the piezoelectric material comprises one or more of PZT, $BaTiO_3$, $PbTiO_3$, $(Bi_{1/2}Na_{1/2})TiO_3$, and $(Bi_{1/2}K_{1/2})TiO_3$.

In some examples, the binder comprises one or more of Ni, Co, and Cr.

In some examples, the reinforcing phase comprises one or more of TiC, WC, SiC, MgO, $TiO_2$, and $ZrO_2$.

The ceramic tool material of the present invention can be prepared into a homogeneous material by uniformly mixing the raw materials, and can also be prepared into a multi-layer material. The material proportion from a surface layer to a bottom layer in the multi-layer material can be increased layer by layer to form the multi-layer gradient ceramic tool material; wherein, the surface layer is a matrix layer, has high hardness, high wear resistance, and high toughness, and can cut metal; a piezoelectric layer has the piezoelectric effect and can convert the cutting force into a charge signal.

When the multi-layer gradient ceramic tool material is provided, it mainly comprises at least one the matrix layer and at least one the piezoelectric layer, for example, when the gradient ceramic cutter material is provided with two layers, it is formed by one of the matrix layer and one of the piezoelectric layer, and a bonding layer can also be provided to increase a bonding property and an electrical conductivity of the matrix layer and the piezoelectric layer, for example, when the gradient ceramic tool material comprises three layers, from the surface layer to the bottom layer, successively comprising the matrix layer, the bonding layer, and the piezoelectric layer; when the gradient ceramic tool material comprises four layers, from the surface layer to the bottom layer, successively comprising the matrix layer, the bonding layer, the piezoelectric layer, and the bonding layer. The bonding layer also comprises metal bonding agents such as Ni, Co, Cr, etc., which not only improves the bonding property between the matrix layer and the piezoelectric layer but also makes the bonding layer have conductivity, thereby improving the transmission is performance of charge signals.

When the multi-layer gradient ceramic tool material is provided, the thickness of the matrix layer is 50%-70% of the total thickness of the ceramic tool material. When the bonding layer is provided, the thickness of the piezoelectric layer is greater than the thickness of the bonding layer, for example, when the gradient ceramic tool material comprises three layers, the thickness of the piezoelectric layer is 25%-45% of the total thickness of the ceramic tool material, and the thickness of the bonding layer is 5%-15% of the total thickness of the ceramic tool material; for example, when the gradient ceramic tool material comprises four layers, the thickness of the piezoelectric layer is 15%-30% of the total thickness of the ceramic tool material, and each the thickness of the two bonding layers is 5%-10% of the total thickness of the ceramic tool material.

According to another embodiment of the present invention, there provides a preparation method of a ceramic tool material with the piezoelectric effect mentioned above, comprising: mixing raw materials, obtaining powder after performing a ball milling and sieving, paving and compacting the powder, and performing a vacuum hot-pressing sintering.

In some examples, anhydrous alcohol is used as a ball milling medium.

When preparing the multi-layer gradient ceramic tool material, the powder is filled and compacted layer by layer, and then sintered by vacuum hot pressing.

In some examples, a pressure (intensity of pressure) of the compaction is 5 MPa-15 MPa. The pressure in the present invention refers to the pressure applied on the unit area and is the intensity of pressure, so the unit is the unit of the intensity of pressure.

In some examples, a sintering temperature of the vacuum hot pressing sintering is 1300° C.-1600° C., a sintering time is 30 min-60 min, and a sintering pressure (intensity of pressure of sintering) is 30 MPa-35 MPa.

Specifically, when preparing a homogeneous ceramic tool material, the parameters of the vacuum hot pressing sintering may be: the sintering temperature is 1350° C.-1600° C., the sintering time is 50 min-60 min, and the sinter pressure is 30 MPa-35 MPa.

Specifically, when preparing the two-layer gradient ceramic tool material, the parameters of the vacuum hot pressing sintering may be: the sintering temperature is 1300° C.-1500° C., the sintering time is 40 min-50 min, and the sintering pressure is 30 MPa-35 MPa.

Specifically, when preparing the three-layer gradient ceramic tool material, the parameters of the vacuum hot pressing sintering may be: the sintering temperature is 1400° C.-1600° C., the sintering time is 30 min-40 min, and the sintering pressure is 30 MPa-35 MPa.

Specifically, when preparing the four-layer gradient ceramic tool material, the parameters of the vacuum hot pressing sintering may be: the sintering temperature is 1300° C.-1500° C., the sintering time is 40 min-50 min, and the sintering pressure is 30 MPa-35 MPa.

According to the third embodiment of the present invention, there provides an application of a ceramic tool material with the piezoelectric effect mentioned above in cutting tools.

According to the fourth embodiment of the present invention, there provides a cutting tool, which is prepared from a ceramic tool material with the piezoelectric effect mentioned above. When a homogeneous ceramic cutter is made by the ceramic tool material with the piezoelectric effect, the Vickers hardness, the bending strength, and the fracture toughness thereof are respectively 15 GPa-17 GPa, 800 MPa-900 MPa, and 6 MPa·m$^{1/2}$-7 MPa·m$^{1/2}$.

According to the fifth embodiment of the present invention, there provides a multi-layer cutting tool, which is prepared from a ceramic tool material with the piezoelectric effect mentioned above, and comprises at least one matrix layer and at least one piezoelectric layer, wherein the matrix layer is made of part of the raw materials of the ceramic tool material with high mechanical properties, and the piezoelectric layer is made of part of the raw materials of the ceramic tool material with piezoelectric effect.

The multi-layer cutting tool is mainly prepared from the above-mentioned multi-layer gradient ceramic tool material.

That is, when the multi-layer cutting tool comprises two layers, it is formed by one the matrix layer and one the piezoelectric layer; when the multi-layer cutting tool comprises three layers, from the surface layer to the bottom layer, successively comprising the matrix lay, the bonding layer, and the piezoelectric layer; when the multi-layer cutting tool comprises four layers, from the surface layer to the bottom layer, successively comprising the matrix lay, the bonding layer, the piezoelectric layer, and the bonding layer; etc.

Specifically, when the multi-layer cutting tool comprises two layers, that is the double-layer gradient ceramic tool with the piezoelectric effect, wherein, the first layer is the matrix layer formed by matrix materials comprising Al$_2$O$_3$, Si$_3$N$_4$, and/or CBN, etc., as well as the binder and the reinforcing phase, the thickness of the first layer accounts for 50%-70% of the total thickness of the cutting tool, and the first layer has high hardness, high wear resistance and high is toughness, and has the function of cutting metal; the second layer is the piezoelectric layer formed by piezoelectric materials comprising PZT, BaTiO$_3$, PbTiO$_3$, (Bi$_{1/2}$Na$_{1/2}$)TiO$_3$, (Bi$_{1/2}$K$_{1/2}$)TiO$_3$, etc., as well as the binder and the reinforcing phase, the thickness of the second layer accounts for 30%-50% of the total thickness of the cutting tool, and the second layer has the piezoelectric effect and can convert cutting force into a charge signal. By measuring, the Vickers hardness, the bending strength, and the fracture toughness respectively are 16 GPa-18 GPa, 900 MPa-1000 MPa, and 7 MPa·m$^{1/2}$-8 MPa·m$^{1/2}$.

Specifically, when the multi-layer cutting tool comprises three layers, that is the three-layer gradient ceramic tool with the piezoelectric effect, wherein, the first layer is the matrix layer formed by matrix materials comprising Al$_2$O$_3$, Si$_3$N$_4$ and/or CBN, etc., as well as the binder and the reinforcing phase, the thickness of the first layer accounts for 50%-70% of the total thickness of the cutting tool, the first layer has high hardness, high wear resistance and high toughness, and has the function of cutting metal; the second layer comprises the bonding layer composed of materials such as Al$_2$O$_3$, Si$_3$N$_4$, CBN, Ni, Co, MgO, etc. (mainly comprising the matrix material, the binder and the reinforcing phase, and the piezoelectric material can also be added), the thickness of the bonding layer accounts for 5%-15% of the total thickness of the cutting tool, and the bonding layer plays a role in bonding the first layer and the third layer of the ceramic cutter; the third layer is the piezoelectric layer formed by piezoelectric materials comprising PZT, BaTiO$_3$, PbTiO$_3$, (Bi$_{1/2}$Na$_{1/2}$)TiO$_3$, (B$_{1/2}$K$_{1/2}$) TiO$_3$, etc., as well as the binder and the reinforcing phase, the thickness of the piezoelectric layer accounts for 25%-45% of the total thickness of the cutting tool, and the piezoelectric layer has piezoelectric effect and can convert cutting force into a charge signal. By measuring, the Vickers hardness, the bending strength, and the fracture toughness respectively are 17 GPa-18 GPa, 1000 MPa-1100 MPa, and 7.5 MPa·m$^{1/2}$-8.5 MPa·m$^{1/2}$.

Specifically, when the multi-layer cutting tool comprises four layers, that is, a four-layer gradient ceramic cutter with piezoelectric effect, wherein, the first layer is the matrix layer formed by the ceramic materials comprising Al$_2$O$_3$ or Si$_3$N$_4$ (comprising corresponding matrix materials, binder and reinforcing phases), the thickness of the first layer accounts for 50%-70% of the total thickness of the cutting tool, and the first layer has high hardness, high wear resistance and high toughness, and has the function of cutting metal; the second lay is the bonding layer formed by materials such as nickel, cobalt, aluminum, Al$_2$O$_3$, Si$_3$N$_4$, etc. (mainly comprising the matrix material, the binder and the reinforcing phase, and the piezoelectric materials can also be added), the thickness of the bonding layer accounts for 5%-10% of the total thickness of the cutting tool, and the bonding layer plays a role in bonding the first layer and the third layer of the gradient ceramic tool and conducting electricity; the third layer is a piezoelectric layer formed by piezoelectric ceramic materials comprising PZT, BaTiO$_3$, ternary piezoelectric ceramics, etc. (comprising corresponding piezoelectric materials, matrix materials, binders and reinforcing phases), the thickness of the piezoelectric layer is 15%-30% of the total thickness of the cutting tool, and the piezoelectric layer has piezoelectric effect and can convert cutting force into the charge signals. The composition and function of the fourth layer are the same as those of the second layer. By measuring, the Vickers hardness, the bending strength, and the fracture toughness of the fourth layer respectively are 16 GPa-17 GPa, 1050 MPa-1100 MPa, and 6.5 MPa·m$^{1/2}$-7.5 MPa·m$^{1/2}$.

In some examples, there comprises a charge collection device, the charge collection device being mounted on a tool holder of the cutting tool.

To enable those skilled in the art to more clearly understand the technical solution of the present invention, the technical solution of the present invention will be described in detail below in combination with specific examples.

In the examples 1 to 4, mixing the material powders for different layers of the ceramic cutter with the piezoelectric effect, performing the ball-milling treatment by taking anhydrous alcohol as a medium, after taking a vacuum drying and sieving, the powder is filled and compacted layer by layer, and after the compaction, carrying out the vacuum hot pressing sintering, so that the ceramic tool material may have the piezoelectric effect. The ceramic tool material with the piezoelectric effect may be made into the ceramic tool with the piezoelectric effect after being cut and polished. The principle of cutting force measurement and cutting tool condition monitoring is shown in FIG. 1. Both the ceramic tool with piezoelectric effect 1 and the charge collection device 2 are fixed on a tool holder 4 by a set screw 3, when the ceramic tool with piezoelectric effect 1 is cutting the metal, the cutting force 5 may cause the ceramic tool with piezoelectric effect to generate the charges 6, and the charges enter a charge amplifier 8 through the charge collecting device 2 and a wire 7 and are then wirelessly transmitted to a cutting force monitoring system 8 through a signal transmitting device, to realize the real-time measurement of the cutting force of the ceramic tool.

Example 1

Figure 2:
FIG. 2 shows a homogeneous ceramic tool with the piezoelectric effect of Example 1 of the present invention.

In a structure of a homogeneous ceramic tool with a piezoelectric effect as shown in FIG. 2, the component materials of the ceramic tool are homogeneous. A weight ratio (wt. %) of the powder components is required for preparing the homogeneous ceramic tool with the piezoelectric effect as shown in Table 1.

TABLE 1

| Weight Ratio (wt. %) of Powder Components | | | | | | |
|---|---|---|---|---|---|---|
| $Al_2O_3$ | TiC | SiC | $ZrO_2$ | Ni | MgO | $BaTiO_3$ |
| rest | 15 | 5 | 1 | 0.5 | 0.5 | 35 |

Putting the powder material into a milling bowl, taking hard alloy balls as milling balls and anhydrous ethanol as a medium, performing the ball milling for 48 hours, then drying a suspension obtained after the ball milling in a vacuum drying oven, sieving the powder obtained after drying with a 100-mesh sieve, and sealing the sieved powder for later use. And then, uniformly mixing the powder according to the component proportion requirement of the ceramic tool material, filling the mixed powder into a mold, performing a pre-compaction treatment under the pressure of 5 MPa, and then putting the mold into a vacuum hot pressing sintering furnace for hot-pressing sintering, wherein the sintering temperature is 1600° C., the sintering time is 60 min, and the sintering pressure is 35 MPa. Cutting and polishing a ceramic blank with high density obtained after sintering to make the homogeneous ceramic tool with the piezoelectric effect. By measuring, the Vickers hardness, bending strength, and fracture toughness of the cutting tool respectively are 16.0 GPa, 850 MPa, and 6.5 MPa·m$^{1/2}$. The cutting tool and a charge collection device are mounted on a tool holder to realize a real-time measurement of cutting force.

Example 2

Figure 3:
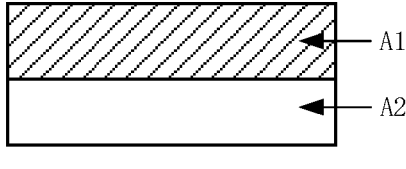
FIG. 3 shows a double-layer gradient ceramic tool with the piezoelectric effect of Example 2 of the present invention.

A structure of a double gradient ceramic tool with a piezoelectric effect as shown in FIG. 3, a first layer (A1) of the double gradient ceramic tool with the piezoelectric effect comprises an $Al_2O_3$ matrix ceramic material, a thickness of the first layer accounts for 60% of a total thickness of the cutting tool; a second layer (A2) comprises piezoelectric material such as $BaTiO_3$, $PbTiO_3$, etc., and a thickness of the second layer accounts for 40% of the total thickness of the cutting tool. Weight ratios (wt. %) of power components of the A1 (the first layer) and the A2 (the second layer) as shown in Table 2.

TABLE 2

| Weight Ratios (Wt. %) of Power Components | | | | | | | |
|---|---|---|---|---|---|---|---|
| Component | $Al_2O_3$ | TiC | SiC | $ZrO_2$ | MgO | $BaTiO_3$ | $PbZrO_3$ |
| A1 | rest | 30 | 5 | 1 | — | — | — |
| A2 | 5 | 5 | — | 1 | rest | 50 | 30 |

Putting the powder material respectively into a ball milling tank, taking hard alloy balls as milling balls and anhydrous ethanol as a medium, performing the ball milling for 48 hours, then drying a suspension obtained after the ball milling in a vacuum drying oven, sieving the powder obtained after drying with a 100-mesh sieve, and sealing the sieved powder for later use. And then, uniformly mixing the powder according to the component proportion requirement of each layer of the ceramic tool material, filling the powder materials into a mold layer by layer according to a sequence of A1/A2 by controlling the thickness of each layer until the powders are filled, wherein each layer of the powders shall be paved and compacted. Performing a pre-compaction treatment under the pressure of 5 MPa, and then putting the mold into a vacuum hot pressing sintering furnace for hot-pressing sintering, wherein the sintering temperature is 1500° C., the sintering time is 50 min, and the sintering pressure is 35 MPa. Cutting and polishing a ceramic blank with high density obtained after sintering to make the double-layer gradient ceramic tool with the piezoelectric effect. By measuring, the Vickers hardness, bending strength, and fracture toughness of the cutter respectively are 17.0 GPa, 950 MPa, and 7.5 MPa·m$^{1/2}$. The cutting tool and a charge collection device are mounted on a tool holder to realize a real-time measurement of cutting force.

Example 3

Figure 4:
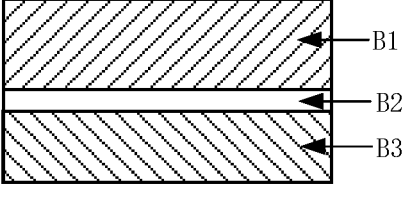
FIG. 4 shows a three-layer gradient ceramic tool with the piezoelectric effect of Example 3 of the present invention.

A structure of a three-layer gradient ceramic tool with a piezoelectric effect is shown in FIG. 4, wherein a first layer (B1) of the three-layer gradient ceramic tool with the piezoelectric effect comprises an $Al_2O_3$ matrix ceramic material, and a thickness of the first layer accounts for 50% of a total thickness of the cutting tool; a second layer (B2) is a mixed layer comprising Ni, Co, $Al_2O_3$, TiC, etc., and a thickness of the second layer accounts for 15% of the total thickness of the cutting tool; a third layer (B3) comprises piezoelectric materials such as $BaTiO_3$, $PbTiO_3$, etc., and a thickness of the third layer (B3) accounts for 35% of the total thickness of the cutting tool. Weight ratios (wt. %) of powder components of the B1 (the first layer), the B2 (the second layer), and the B3 (the third layer) as shown in Table 3.

TABLE 3

| Weight Ratios (Wt. %) of Powder Components | | | | | | | |
|---|---|---|---|---|---|---|---|
| Component | $Al_2O_3$ | TiC | MgO | Ni | Co | $PbZrO_3$ | $BaTiO_3$ |
| B1 | rest | 30 | 5 | 2 | — | — | — |
| B2 | 35 | 5 | 2 | rest | 15 | — | 50 |
| B3 | 5 | 5 | 5 | — | — | 50 | 40 |

Putting the powder material respectively into a ball milling tank, taking hard alloy balls as milling balls and anhydrous ethanol as a medium, performing the ball milling for 48 hours, then drying a suspension obtained after the ball milling in a vacuum drying oven, sieving the powder obtained after drying with a 100-mesh sieve, and sealing the sieved powder for later use. And then, uniformly mixing the powder according to the component proportion requirement of each layer of the ceramic tool material, filling the powder materials into a mold layer by layer according to a sequence of B1/B2/B3 by controlling the thickness of each layer until the powders are filled, wherein each layer of the powders shall be paved and compacted. Performing a pre-compaction treatment under the pressure of 15 MPa, and then putting the mold into a vacuum hot pressing sintering furnace for hot-pressing sintering, wherein the sintering temperature is 1600° C., the sintering time is 40 min, and the sintering pressure is 35 MPa. Cutting and polishing a ceramic blank with high density obtained after sintering to make the three-layer gradient ceramic tool with the piezoelectric effect. By measuring, the Vickers hardness, bending strength, and fracture toughness of the cutter respectively are 17.5 GPa, 1050 MPa, and 8.0 MPa·m$^{1/2}$. The cutting tool and a charge collection device are mounted on a tool holder to realize a real-time measurement of cutting force.

Example 4

Figure 5:
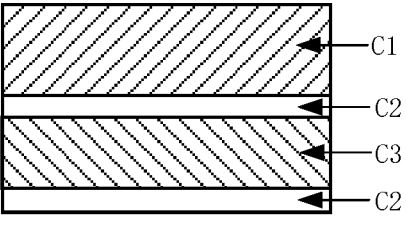
FIG. 5 shows a four-layer gradient ceramic tool with the piezoelectric effect of Example 4 of the present invention.

A structure of a four-layer gradient ceramic tool with a piezoelectric effect is shown in FIG. 5, a first layer (C1) of the four-layer gradient ceramic tool with the piezoelectric effect comprises an Al$_2$O$_3$ matrix ceramic material, a thickness of the first layer accounts for 50% of the total thickness of the cutting tool; a second layer (C2) is a mixed layer of nickel, cobalt, aluminum, Al$_2$O$_3$, Si$_3$N$_4$, and other materials, a thickness of the second layer accounts for 8% of the total thickness of the cutting tool; a third layer (C3) comprises materials such as PZT, etc., a thickness of the third layer accounts for 34% of the total thickness of the cutting tool; a fourth layer is consistent with the second layer, a thickness of the fourth layer accounts for 8% of the total thickness of the cutting tool. Weight ratios (wt. %) of powder components of the C1 (the first lay), the C2 (the second layer and the fourth lay), and the C3 (the third layer) as shown in Table 4.

TABLE 4

| Weight Ratios (Wt. %) Of Powder Components | | | | | | | |
|---|---|---|---|---|---|---|---|
| Component | Al$_2$O$_3$ | TiC | SiC | ZrO$_2$ | Ni | Co | PbZrO$_3$ |
| C1 | rest | 30 | 5 | 1 | — | — | — |
| C2 | 40 | 5 | — | — | rest | 10 | — |
| C3 | 10 | 5 | — | — | — | — | rest |

Putting the powder material respectively into a ball milling tank, taking hard alloy balls as milling balls and anhydrous ethanol as a medium, performing the ball milling for 48 hours, then drying a suspension obtained after the ball milling in a vacuum drying oven, sieving the powder obtained after drying with a 100-mesh sieve, and sealing the sieved powder for later use. And then, uniformly mixing the powder according to the component proportion requirement of each layer of the ceramic tool material, filling the powder materials into a mold layer by layer according to a sequence of C1/C2/C3/C2 by controlling the thickness of each layer until the powders are filled, wherein each layer of the powders shall be paved and compacted. Performing a pre-compaction treatment under the pressure of 15 MPa, and then putting the mold into a vacuum hot pressing sintering furnace for hot-pressing sintering, wherein the sintering temperature is 1500° C., the sintering time is 50 min, and the sintering pressure is 35 MPa. Cutting and polishing a ceramic blank with high density obtained after sintering to make the gradient ceramic tool with the piezoelectric effect. By measuring, the Vickers hardness, bending strength, and fracture toughness of the cutter respectively are 16.5 GPa, 1075 MPa, and 7.0 MPa·m$^{1/2}$. The cutting tool and a charge collection device are mounted on a tool holder to realize a real-time measurement of cutting force.

The foregoing descriptions are merely preferred examples of the present invention, but are not intended to limit the present invention. A person skilled in the art may make various alterations and variations to the present invention. Any modification, equivalent replacement, or improvement made within the spirit and principle of the present invention shall fall within the protection scope of the present invention.

What is claimed is:

1. A ceramic tool material with piezoelectric effect, comprising, in parts by weight: 30-70 parts of matrix material, the matrix material comprising one or more of Al$_2$O$_3$, Si$_3$N$_4$, and CBN; 30-70 parts of piezoelectric material, the piezoelectric material comprising one or more of PZT, BaTiO$_3$, PbTiO$_3$, (Bi$_{1/2}$Na$_{1/2}$) TiO$_3$, and (Bi$_{1/2}$K$_{1/2}$) TiO$_3$; 5-10 parts of binder, the binder comprising one or more of Ni, Co, and Cr; and 10-20 parts of reinforcing phase, the reinforcing phase comprising one or more of TiC, WC, SiC, MgO, TiO$_2$, and ZrO$_2$.

2. The ceramic tool material with piezoelectric effect as claimed in claim 1, wherein, the ceramic tool material is a multi-layer gradient ceramic tool material.

3. The ceramic tool material with piezoelectric effect as claimed in claim 2, wherein the matrix material is in a different layer from the piezoelectric material.

4. The ceramic tool material with piezoelectric effect as claimed in claim 2, wherein the matrix material is in matrix layer, a thickness of the matrix layer being 50%-70% of a total thickness of the ceramic tool material, and the piezoelectric material is in a piezoelectric layer, a thickness of the piezoelectric layer being 15%-30% of the total thickness of the ceramic tool material.

5. The ceramic tool material with piezoelectric effect as claimed in claim 2, wherein the multi-layer gradient ceramic tool material comprises four layers.

6. The ceramic tool material with piezoelectric effect as claimed in claim 2, wherein the multi-layer gradient ceramic tool material comprises at least three layers.

7. A cutting tool, being prepared from a ceramic tool material with piezoelectric effect as claimed in claim 1.

8. A cutting tool as claimed in claim 7, further comprising:
a tool holder,
a charge collection device between the tool holder and a bottom surface of the cutting tool, the charge collection device being connected to a charge amplifier, and
a wire that connects a top surface of the cutting tool and the charge amplifier.

9. A multi-layer cutting tool, being prepared from a ceramic tool material with piezoelectric effect as claimed in claim 1, comprising a matrix layer and a piezoelectric layer, wherein the matrix layer comprises the matrix material, and the piezoelectric layer comprises the piezoelectric material.

10. The multi-layer cutting tool as claimed in claim 9, wherein:
the multi-layer cutting tool is a two-layer cutting tool,
a first layer is the matrix layer, and a thickness of the matrix layer accounts for 50%-70% of a total thickness of the cutting tool, and a second layer is the piezoelectric layer, and a thickness of the piezoelectric layer accounts for 30%-50% of the total thickness of the cutting tool.

11. The multi-layer cutting tool as claimed in claim 9, wherein:

the multi-layer cutting tool is a three-layer cutting tool, a first layer is the matrix layer, and a thickness of the matrix layer accounts for 50%-70% of a total thickness of the cutting tool, a second layer is a bonding layer, and a thickness of the bonding layer accounts for 5%-15% of the total thickness of the cutting tool, and a third layer is the piezoelectric layer, and a thickness of the piezoelectric layer accounts for 25%-45% of the total thickness of the cutting tool.

12. The multi-layer cutting tool as claimed in claim 9, wherein, wherein:

the multi-layer cutting tool is a four-layer cutting tool, a first layer is the matrix layer, and a thickness of the matrix layer accounts for 50%-70% of a total thickness of the cutting tool, a second layer and a fourth layer are bonding layers, and a thickness of each bonding layer accounts for 5%-10% of the total thickness of the cutting tool, and a third layer is the piezoelectric layer, and a thickness of the piezoelectric layer accounts for 15%-30% of the total thickness of the cutting tool.

* * * * *